(12) United States Patent
Kim et al.

(10) Patent No.: US 8,155,704 B2
(45) Date of Patent: Apr. 10, 2012

(54) DISPLAY DEVICE

(75) Inventors: Hun-Bae Kim, Seoul (KR); Jin-Oh Kwag, Suwon-si (KR); Ki-Sik Park, Suwon-si (KR); Jeong-Il Oh, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 742 days.

(21) Appl. No.: 12/246,794

(22) Filed: Oct. 7, 2008

(65) Prior Publication Data
US 2009/0186661 A1 Jul. 23, 2009

(30) Foreign Application Priority Data

Jan. 21, 2008 (KR) .................. 10-2008-0006268

(51) Int. Cl.
*H04M 1/00* (2006.01)
*H04K 3/00* (2006.01)

(52) U.S. Cl. ............ 455/566; 345/168; 349/58
(58) Field of Classification Search ............ 455/550.1, 455/566; 345/168–169, 204–206; 349/58
See application file for complete search history.

(56) References Cited

U.S. PATENT DOCUMENTS

| 6,823,198 B2 * | 11/2004 | Kobayashi ............... 455/556.1 |
| 2008/0030475 A1 * | 2/2008 | Shin ............................ 345/169 |

FOREIGN PATENT DOCUMENTS

| JP | 2001284854 | 10/2001 |
| JP | 2003110675 | 4/2003 |
| KR | 1020070012077 A | 1/2007 |

* cited by examiner

*Primary Examiner* — Lee Nguyen
(74) *Attorney, Agent, or Firm* — Cantor Colburn LLP

(57) ABSTRACT

A display device includes a printed circuit board disposed at a rear of a display panel. The printed circuit board includes a main board portion, an auxiliary board portion and a connection board portion continuously disposed with each other.

21 Claims, 9 Drawing Sheets

100 ( 110, 120, 130 )
300 ( 310, 320, 330 )
1000 ( 200, 300, 400, 500 )

DISPLAY DEVICE

This application claims priority to Korean Patent application No. 10-2008-0006268, filed on Jan. 21, 2008, and all the benefits accruing therefrom under 35 U.S.C. 119, the contents of which are herein incorporated by reference in their entirety.

BACKGROUND OF THE INVENTION

1. Field of the Invention

The present invention relates to a display device, and more particularly, to a display device, including a printed circuit board positioned in the rear of a display panel, and including a main board portion and an auxiliary board portion integrally formed.

2. Description of the Related Art

The application range of a liquid crystal display ("LCD") has been extended because of its relative lightweight, thin thickness, low-power drive, full color and high resolution characteristics. The LCD is used in computers, notebook computers, personal digital assistants ("PDAs"), cellular phones, televisions, audio/video devices, and the like. Among the electronic devices in which the LCD is employed, the cellular phones are classified into a folder type, a bar type and a slide type, according to their overall shapes.

A slide-type cellular phone includes a sliding module provided with a battery and various button input portions including number buttons, and a main module provided on the sliding module and includes a main board portion connected to an LCD panel to control the LCD panel and an auxiliary board portion connected to the main board portion and provided with direction buttons, and the like.

In the slide-type cellular phone, the main board portion and the auxiliary board portion are manufactured as separate printed circuit boards, and then must be connected to each other.

BRIEF SUMMARY OF THE INVENTION

Since a slide-type cellular phone includes a main board portion and an auxiliary board portion manufactured as separate printed circuit boards, there are disadvantages in manufacturing the slide-type cellular phone. For example, a number of components, manufacturing costs, and time for assembly are increased with the separately manufactured main board portion and auxiliary board portion. Additionally, the separately manufactured main board portion and auxiliary board portion must subsequently be connected to each other. To provide a connection, each of the main board portion and the auxiliary board portion may include a connector mounted respectively thereto, which further increases the number of components, manufacturing costs and time for assembly of the cellular phone. Furthermore, still another component, such as a flexible printed circuit board is connected to each of the respective connectors of the main board portion and the auxiliary board portion, further increasing the number of components, manufacturing costs and time for assembly of the cellular phone.

An exemplary embodiment provides a display device including a printed circuit board The printed circuit board includes a main board portion and an auxiliary board portion integrally formed.

An exemplary embodiment provides a display device including a printed circuit board capable of reducing a manufacturing cost.

In an exemplary embodiment, there is provided a display device including a display panel displaying images, and a printed circuit board disposed in the rear of the display panel. The printed circuit board includes a main board portion connected to the display panel, a connection board portion extending from a region of a side of the main board portion, and an auxiliary board portion extending from the connection board portion. The main board portion, the connection board portion and the auxiliary board portion are disposed continuously with each other.

The connection board portion may be disposed at a first side or at the first side and a second side of the side of the main board portion, the second side being opposite to the first side relative to the main board portion. A connection space may be defined between the main board portion and the auxiliary board portion. The display device may further include a flexible printed circuit board connecting the display panel to the main board portion.

The main board portion, the connection board portion and the auxiliary board portion may extend in a first direction, and a length of the connection board portion in a second direction substantially perpendicular to the first direction may be smaller than lengths of the main board portion and the auxiliary board portion in the second direction. In addition, the flexible printed circuit board may connect the display panel to the main board portion through the connection space. The connection space may include a space corresponding to a thickness of the flexible printed circuit board, and a working space of a dimension required to connect the display panel to the main board portion through the flexible printed circuit board.

The display device may further include a display panel driver connected to the display panel and driving the display panel. The flexible printed circuit board may be connected to the display panel driver. The display panel driver may be disposed on the display panel adjacent to the auxiliary board portion. A first end of the flexible printed circuit board may be connected to the display panel driver, and a second opposing end thereof may be connected to a side of the main board portion adjacent to the auxiliary board portion.

The display device may further include a functional module connected to the main board portion. The functional module may include at least one of a vibration module, a speaker module and a camera module. The functional module may be connected to a side of the main board portion opposing the auxiliary board portion relative to the main board portion.

The display panel may be positioned on a first surface of the main board portion, and an element controlling the display panel may be mounted on a second surface of the main board portion opposing the first surface. In addition, one or more buttons for sending a signal to the main board portion may be provided on one surface of the auxiliary board portion.

Wires may be disposed on the main board portion, the auxiliary board portion and the connection board portion. The wires of the main board portion and the auxiliary board portion may be connected to each other through the wires of the connection board portion. The printed circuit board may include a multi-layered printed circuit board. The multi-layered printed circuit board may include at least one resin layer and at least one wiring layer alternately disposed with each other. The number of layers of the main board portion may be different from that of the connection board portion.

The display device may further include a sliding module slidably disposed with the display device at a rear of the display device. The sliding module may include a communication module, a keypad portion provided with one or more buttons, and a battery.

In an exemplary embodiment, there is provided a cellular phone including a display device and a sliding module slidably disposed at a rear of the display device. The display device includes a display panel displaying images, and a printed circuit board disposed at a rear of the display panel. The printed circuit board includes a main board portion connected to the display panel, a connection board portion extending from a region of a side of the main board portion, and an auxiliary board portion extending from the connection board portion.

A connection space may be defined between the main board portion and the auxiliary board portion. The cellular phone may further include a flexible printed circuit board connecting the display panel to the main board portion through the connection space. The sliding module may include a communication module, a keypad portion provided with one or more buttons, and a battery.

In an exemplary embodiment, there is provided a method of forming a display device. The method includes forming a printed circuit board as an indivisible unit, forming a display panel displaying images, and disposing the printed circuit board at a rear of the display panel. The printed circuit board includes a main board portion connected to the display panel, an auxiliary board portion, a connection board portion disposed between the main board portion and the auxiliary board portion, and a connection passage disposed between the main board portion and the auxiliary board portion where the connection board portion is not disposed.

BRIEF DESCRIPTION OF THE DRAWINGS

Exemplary embodiments of the present invention can be understood in more detail from the following description taken in conjunction with the accompanying drawings, in which.

DETAILED DESCRIPTION OF THE INVENTION

Hereinafter, exemplary embodiments of the present invention will be described in detail with reference to the accompanying drawings.

Figure 4A:
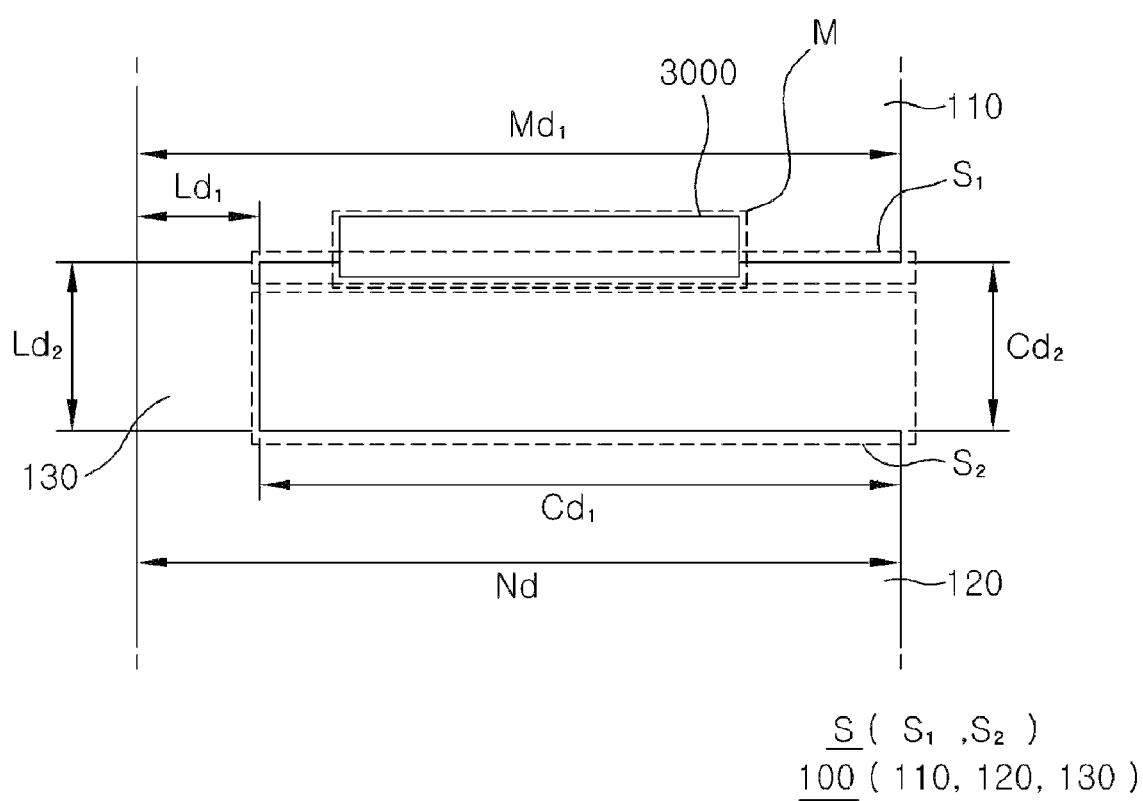
FIGS. 4A and 4B are enlarged plan views of exemplary embodiments of portion B of FIG. 3A.
Figure 4B:
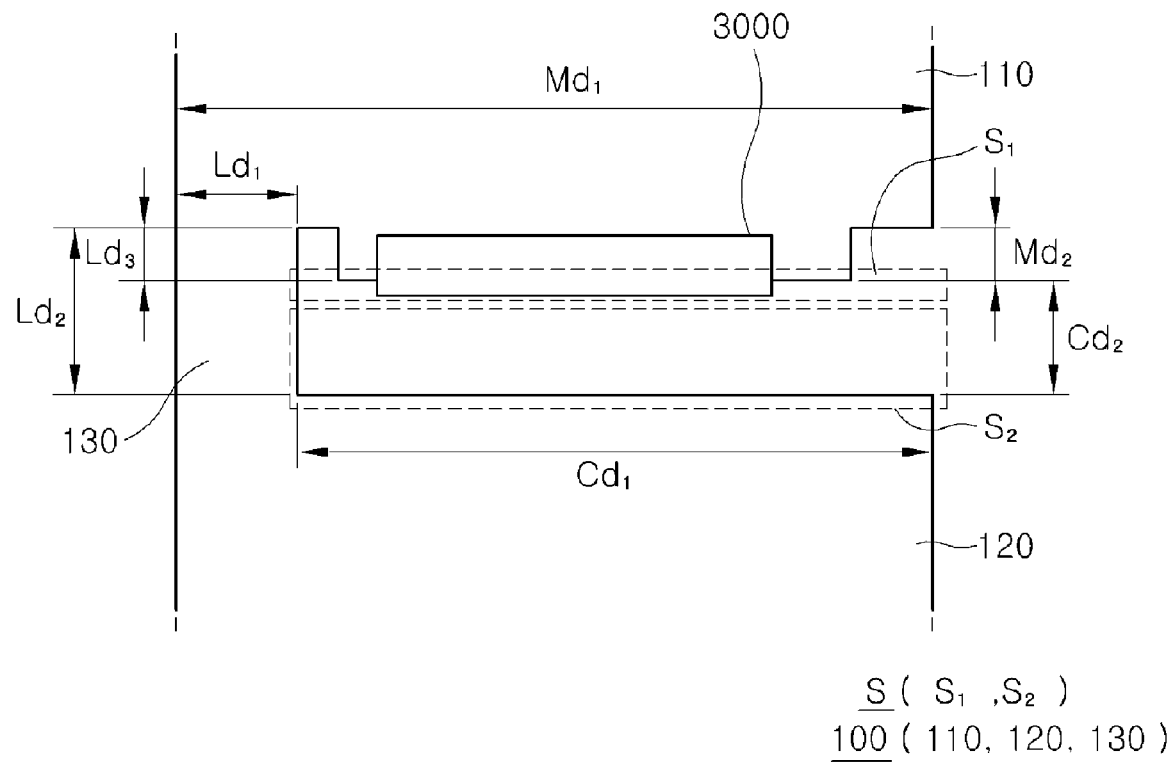

However, the present invention is not limited to the embodiments disclosed below but may be implemented into different forms. These embodiments are provided only for illustrative purposes and for full understanding of the scope of the present invention by those skilled in the art. Throughout the drawings, like reference numerals are used to designate like elements. In addition, for convenience of explanation, the elements are exaggeratively expressed in the drawings. For example, although it is illustrated in FIGS. 4A and 4B that an installation space $S_1$ and a working space $S_2$ include (e.g., overlap) a region of a printed circuit board 100, the installation space $S_1$ and the working space $S_2$ are intended to indicate a space between a main board portion 110 and an auxiliary board portion 120.

It will be understood that when an element or layer is referred to as being "on", "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower", "under," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

Figure 1:
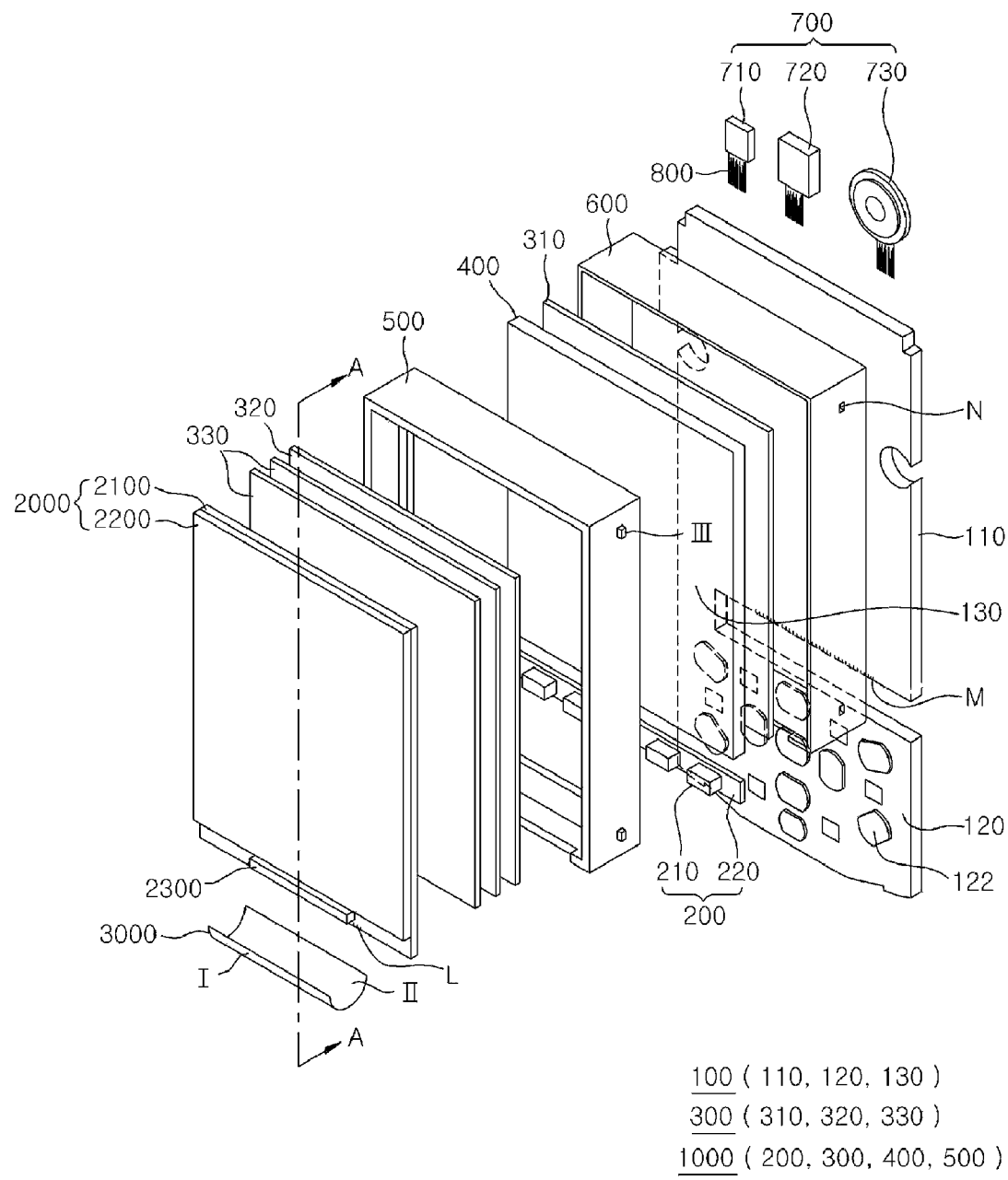
FIG. 1 is a schematic exploded perspective view of an exemplary embodiment of a liquid crystal display ("LCD") according to the present invention.
Figure 2:
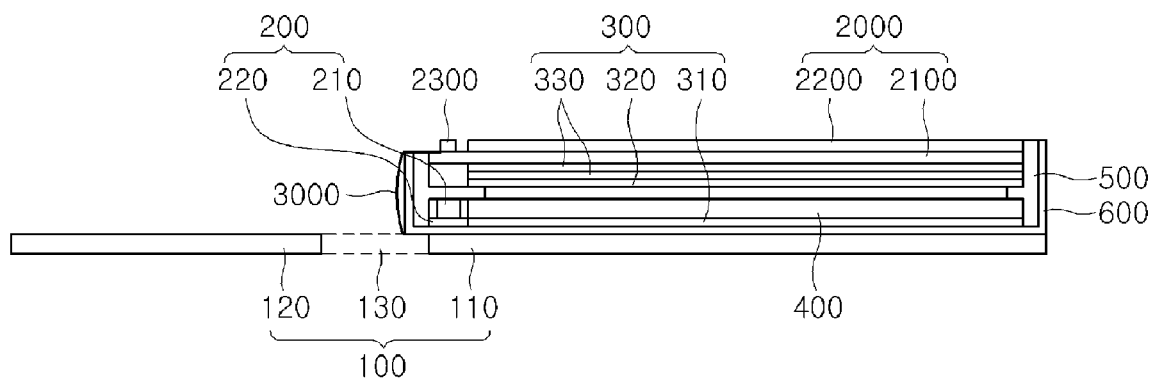
FIG. 2 is a schematic cross-sectional view taken along line A-A of FIG. 1.
Figure 3A:
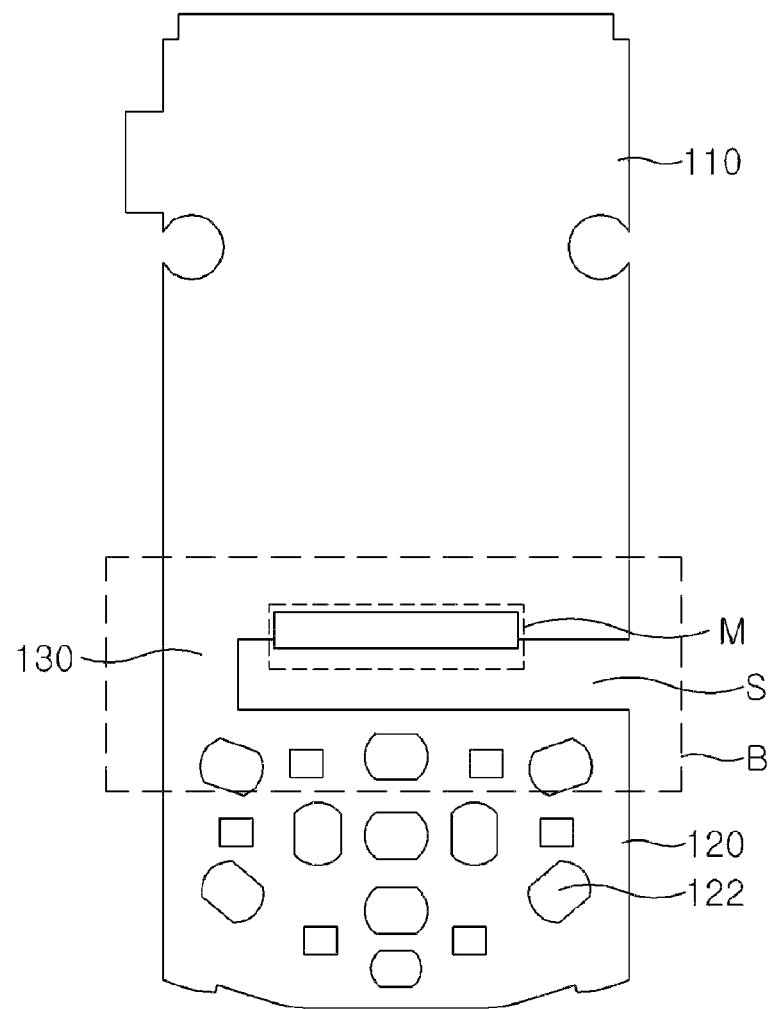
FIGS. 3A and 3B are schematic plan views of exemplary embodiments of printed circuit boards according to the present invention.
Figure 3B:
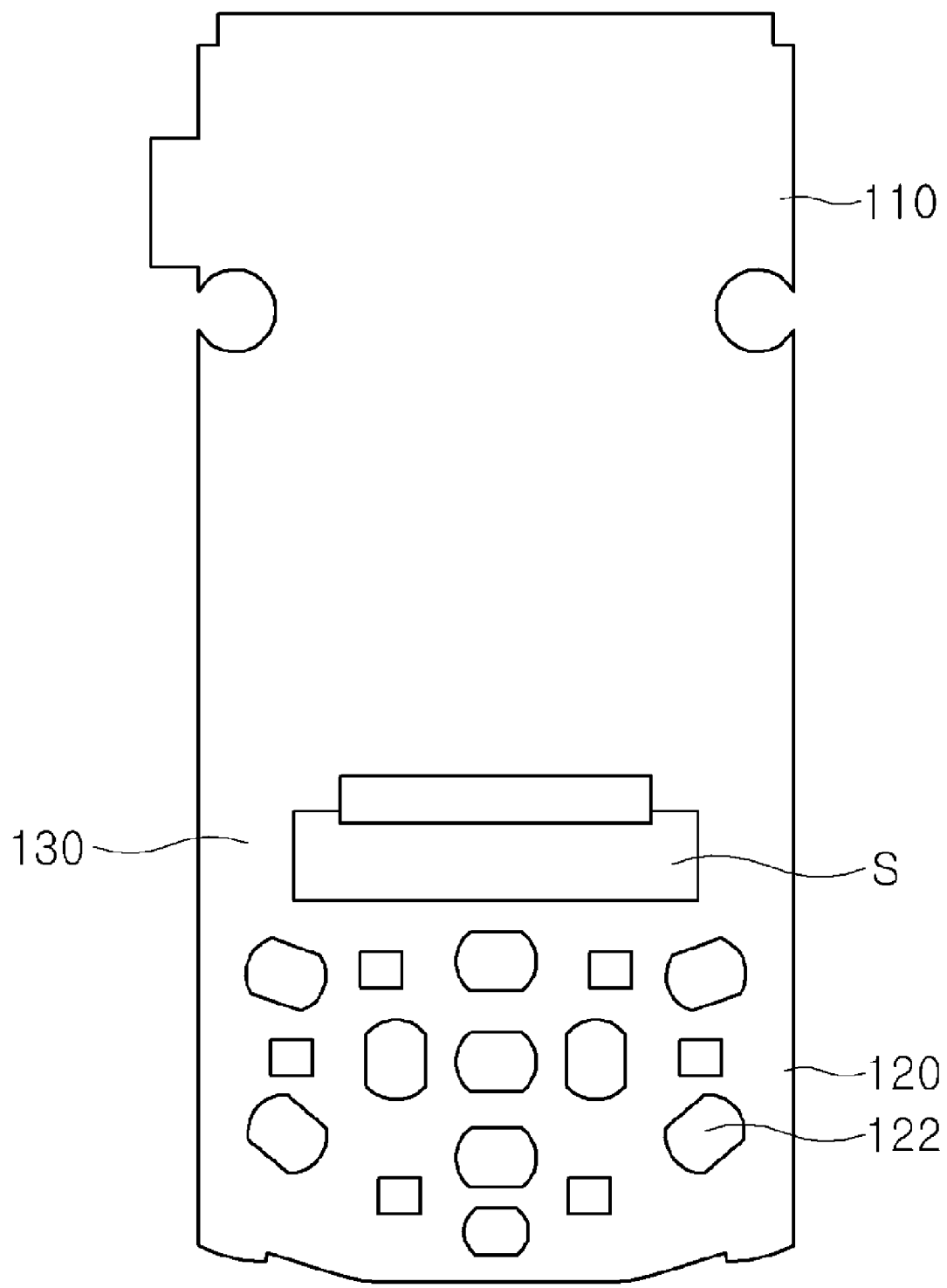
Figure 5:
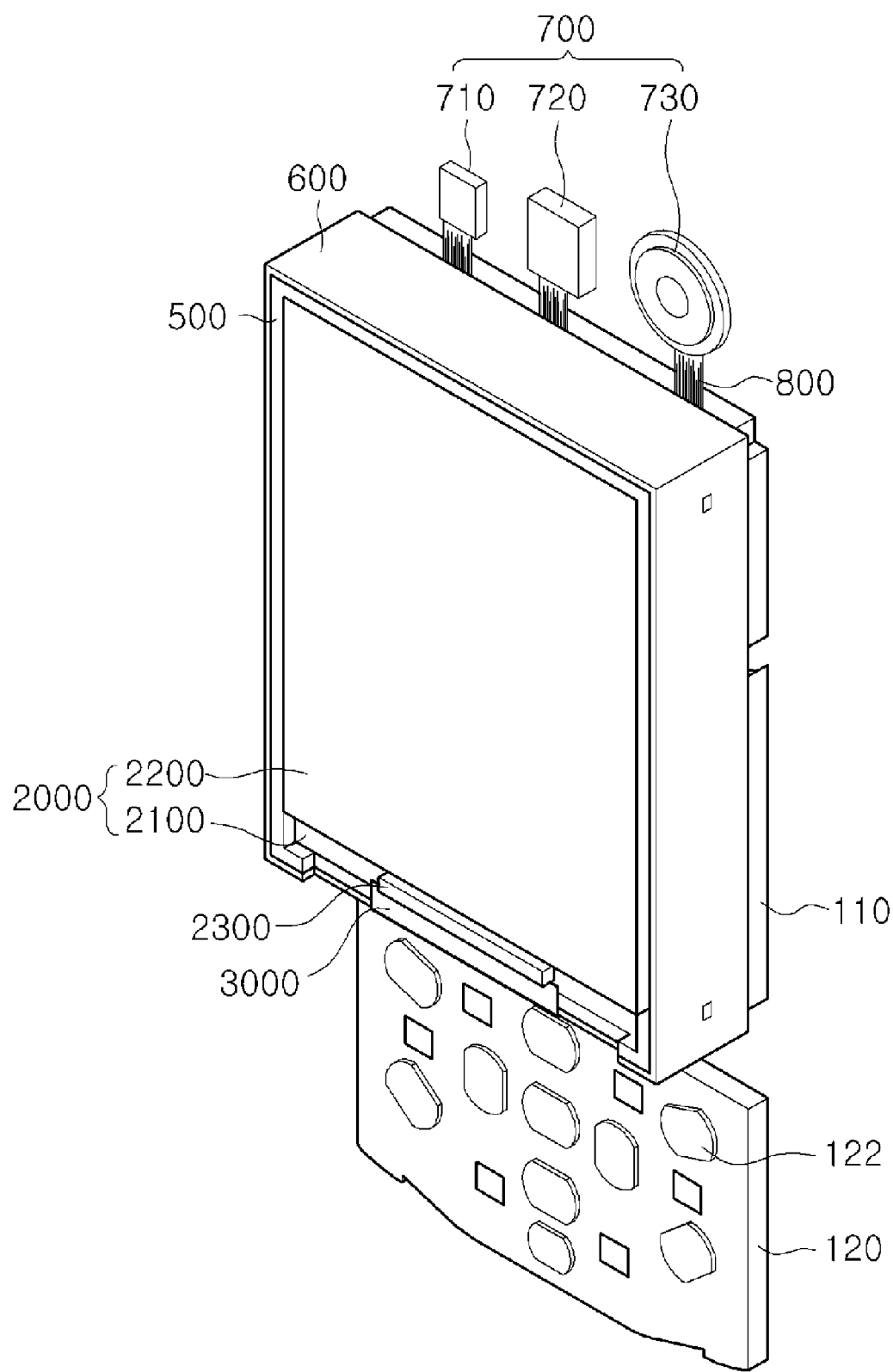
FIG. 5 is a perspective view of an exemplary embodiment of an assembled state of the LCD of FIG. 1.

FIG. 1 is a schematic exploded perspective view of an exemplary embodiment of an LCD according to the present invention, FIG. 2 is a schematic sectional view taken along line A-A of FIG. 1, FIGS. 3A and 3B are schematic plan views illustrating exemplary embodiments of printed circuit boards according to the present invention, FIGS. 4A and 4B are enlarged plan views of portion B of FIG. 3A, and FIG. 5 is a perspective view of an exemplary embodiment of an assembled state of the LCD of FIG. 1.

As shown in FIGS. 1 and 2, the LCD according to the illustrated embodiment of the present invention includes an LCD panel 2000, a backlight unit 1000 supplying light to the LCD panel 2000, and a printed circuit board 100 driving and/or controlling the LCD panel 2000 and/or the backlight unit 1000. The LCD may include a receiving member 600 receiving, accommodating and protecting the LCD panel 2000 and the backlight unit 1000.

In addition, the LCD may further include various functional modules 700 connected to the printed circuit board 100. In exemplary embodiments, the functional module 700 may include sub-modules which include, but are not limited to, a vibration module 710 providing an incoming alarm, a speaker module 720 outputting sound, and/or a camera module 730 for photographing an image. The functional module 700 as illustrated in FIG. 1, may be provided on an upper portion of a main board portion 110. The upper portion of the main board portion 110 is located at an opposite side of the main board portion 100 relative to an auxiliary board portion 120. The functional module 700, such as including a plurality of sub-modules, may be connected to the main board portion 110 through one or more of a flexible printed circuit board 800.

In an exemplary embodiment, the illustrated LCD may be applied to a slide-type cellular phone, such that the LCD may include a sliding module slidably disposed at a rear of the LCD. As used herein, the rear of the LCD indicates a side of the LCD opposite to a viewing, or front, side of the LCD. The sliding module of the LCD may include a communication module for performing incoming and outgoing functions of a cellular phone, a keypad portion provided with one or more buttons, e.g., number buttons, and a battery.

The LCD panel 2000 displays images, and may include a thin film transistor substrate 2100 for performing a switch function, and a color filter substrate 2200 for expressing colors.

The thin film transistor substrate 2100 may include a plurality of thin film transistors (not shown) formed thereon. In an exemplary embodiment, the thin film transistor substrate 2100 may be a light-transmissive insulating substrate, including a plurality of pixel regions disposed substantially in a matrix form. A plurality of thin film transistors and pixel electrodes (not shown) may be provided in the pixel regions. A rectangular glass substrate may be effectively used as the insulating substrate for forming the thin film transistors and the pixel electrodes. The thin film transistor substrate 2100 may be divided into a display region overlapping with the color filter substrate 2200 and displaying images, and a non-display region non-overlapping with the color filter substrate 2200 and exposed outside of the color filter substrate 2200, such as when the thin film transistor substrate 2100 is coupled to the color filter substrate 2200 and formed with a signal application line for applying a signal to the display region.

Source terminals of the plurality of thin film transistors are connected to data lines (not shown) extending in a first direction, and gate terminals thereof are connected to gate lines (not shown) extending in a second direction substantially perpendicular to the first direction. Drain terminals (not shown) thereof are connected to the pixel electrodes made of a transparent conductive material and formed in portions of the pixel regions. In one exemplary embodiment, as the transparent conductive material, indium tin oxide (ITO) or indium zinc oxide (IZO) may be preferably used.

In the thin film transistor substrate 2100, when electrical signals are input into the gate lines and the data lines, the thin film transistors are turned on or off, so that the electrical signals of the data lines, i.e., the electrical signals required for forming pixels, are applied to the pixel electrodes. An exemplary embodiment of the LCD according to the present invention may further include an additional LCD panel driver 2300 driving the gate lines and the data lines. The LCD panel driver 2300 may be formed in the non-display region of the thin film transistor substrate 2100, such as in the form of an integrated circuit ("IC").

As illustrated in FIG. 1, a first connection portion L, which may be a group of individual wires connected to the LCD panel driver 2300, may be formed in the non-display region. The first connection portion L may be connected to the main board portion 110 through a flexible printed circuit board 3000. Since the flexible printed circuit board 3000 may be connected to the LCD panel 2000 and the main board portion 110 through an area (e.g., a passage or space) between the main board portion 110 and the auxiliary board portion 120, the LCD is configured so that the non-display region of the LCD panel 2000 is disposed toward a lower side of the LCD, i.e., toward the auxiliary board portion 120.

The color filter substrate 2200 may preferably be a light-transmissive insulating substrate. Pixel regions of the color filter substrate may be disposed corresponding to the thin film transistor substrate 2100, such as to the pixel regions of the thin film transistor substrate 2100. In the color filter substrate 2200, color filters (not shown) and a common electrode (not shown) are disposed in the pixel regions. In an exemplary embodiment, the color filters and the common electrode may preferably be disposed in the plurality of pixel regions corresponding to the pixel electrodes, and the common electrode may be preferably disposed on an entire surface of the color filter substrate 2200. In addition, a black matrix pattern (not shown) for reducing or effectively preventing light leakage may be formed on the color filter substrate 2200. A common voltage is applied to the common electrode. As used herein, elements may be considered as "corresponding" in shape, size or positional placement relative to another element, such as substantially similar in shape, size or positional placement relative to that other element.

Referring again to FIG. 1, the backlight unit 1000 includes a light source unit 200, a light guide plate 400, an optical member 300 and a mold frame 500.

The light guide plate 400 converts light emitted from a unit of discrete light sources into light having an optical distribution in the form of a surface light source. The discrete light sources may include point light sources, such as light emitting diodes ("LEDs"). The light guide plate 400 may be made of a substantially transparent material having a certain refractive index. Transparent materials of the light guide plate 400 may include, but are not limited to, polyolefin or polycarbonate, which is polymethylmethacrylate (PMMA) among acrylic resins. The light guide plate 400 may include at least one of a molded light guide plate, a light-scattering light guide plate and a hollow light guide plate. In one exemplary embodiment, a light emitting diode unit is installed at a side surface of the light guide plate 400. Light emitted from the light emitting diode unit is incident on the side surface of the light guide plate 400, and then exits from the light guide plate 400 through an upper surface or portion of the light guide plate 400. This upper surface may also be referred to as a "light emitting surface."

In the illustrated embodiment, the light source unit 200, also referred to as a main light source of the backlight unit 1000, may include light emitting diodes 210 and a substrate 220 upon which the light emitting diodes 210 are mounted. In one exemplary embodiment, the mounting substrate 220 may be formed of a flexible printed circuit board having flexibility. The flexible printed circuit board may include a circuit formed therein or thereon to supply external power to the light emitting diodes 210. The light source unit 200 may be coupled a side portion of the light guide plate 400. The light source unit 200 may be permanently fixed or removably fixed to the light guide plate 400. The light source unit 200 may be coupled to the light guide plate 400 by means of an adhesive member (not shown), such as a double-sided adhesive tape. However, the fixing of the light source unit 200 is not limited thereto, but may be fixed to a rear surface of the LCD panel 2000 and be positioned at the side surface of the light guide plate 400.

As illustrated in FIG. 1, the optical member 300 may be disposed both over (e.g., towards the front or viewing side of the LCD) and under (e.g., towards the rear of the LCD) the light guide plate 400 to ensure the uniform luminance distribution of the emitted light. The optical member 300 may include a plurality of elements, including but not limited to, a diffusion sheet 320, one or more of a prism sheet 330 and a reflection sheet 310. The diffusion sheet 320 causes light incident from the light source unit 200 to travel toward a front surface of the LCD panel 2000, diffuses the light to be uniformly distributed in a wide range, and illuminates the LCD panel 2000. The prism sheets 330 cause slantingly-incident light of the entire incident light to exit substantially vertically. In the illustrated embodiment, the prism sheet 330 includes two prism sheets, i.e., a first prism sheet for polarizing light from the diffusion sheet 320 in a first direction, and a second prism sheet for polarizing light in a second direction substantially vertical to the first prism sheet. The reflection sheet 310 reflects the light exiting from a lower surface of the light guide plate 400 to be re-incident on the light guide plate 400. To reflect light leaking from the light guide plate 40, the reflection sheet 310 may be positioned under the light guide plate 400.

The mold frame 500 accommodates the backlight unit 1000 and fixes a position of the backlight unit 1000. The mold frame 500 may be formed substantially in the shape of a quadrangular frame, and may include a plane portion (e.g., a bottom plate) and sidewalls extending from the plane portion, such as at a substantially right angle. The bottom plate and the sidewalls may be formed continuously, or may be formed of separated members subsequently assembled together as the mold frame 500. A seating portion (not shown) may be formed on the plane portion so that the LCD panel 2000 can be seated thereon. The seating portion may include fixing protrusions (not shown) and/or stepped projection surfaces for aligning and/or positioning the LCD panel 2000. The fixing protrusions and the stepped projection surfaces may contact with edge side surfaces of the LCD panel 2000, to thereby align and/or position the LCD panel 2000. Referring to FIG. 1, the mold frame 500 may be coupled to the receiving member 600 using protrusions III disposed on outer side surfaces of the mold frame 500, and corresponding holes N disposed partially in or completely through side surfaces of the receiving member 600.

The printed circuit board 100 controls the LCD panel 2000 and the backlight unit 1000. The printed circuit board 100 may include the main board portion 110, the auxiliary board portion 120, and a connection board portion 130 partially connecting the main board portion 110 and the auxiliary board portion 120. As used herein, the connection board portion 130 defines a connection space S (FIGS. 3A and 3B) between the main board portion 110 and the auxiliary board portion 120.

The main board portion 110 generates an image signal and applies the image signal to the LCD panel 2000, and includes wires (not shown) therein or thereon. The main board portion 110 may be formed in a generally rectangular shape in plan view. The LCD panel 2000 may be mounted on a first surface of the main board portion 110, and various elements (not shown) required for driving the LCD panel 2000 may be mounted on a second surface of the main board portion 110, the second surface being opposite to the first surface.

A second connection portion M may be disposed in a lower portion of the first surface of the main board portion 110, such as to be connected to one end of the flexible printed circuit board 3000 connected to the LCD panel 2000 at an opposing end of the flexible printed circuit board 3000. If there is no sufficient space at the lower portion of the first surface of the main board portion 110, the second connection portion M may be disposed in a lower portion of the second surface of the main board portion 110. In an exemplary embodiment, the second connection portion M may be preferably connected to the wire formed on the main board portion 110.

As illustrated in FIG. 1, the second connection portion M may be preferably disposed in a position corresponding to the first connection portion L formed on the LCD panel 2000. In one exemplary embodiment, where the first connection portion L is formed at a lower central portion of the LCD panel 2000, if the second connection portion M is formed at a lower central portion of the main board portion 110, the first connection portion L and the second connection portion M can be advantageously connected using the flexible printed circuit board 3000. Further, as in the illustrated embodiment, one end I of the flexible printed circuit board 3000 may be connected to the first connection portion L of the main board portion 110, and the other (e.g., opposing) end II thereof may be connected to the second connection portion M of the main board portion 110.

Referring to FIGS. 1, 3A and 3B, the auxiliary board portion 120 includes buttons 122 for controlling the LCD panel 2000. The buttons 122 may includes a plurality of button members including, but not limited to, direction indicating buttons, confirmation button(s), cancel button(s), and the like.

The auxiliary board portion 120 may be formed substantially in a quadrangular shape in plan view, similar to the main board portion 110 described above. In the illustrated embodiments of FIGS. 3A and 3B, where the main board portion 110 to be mounted with the LCD panel 2000 is formed in a substantially rectangular shape, the main board portion 110 may have a longer ordinate length (e.g., along a vertical direction of FIGS. 3A and 3B) than an abscissa length (e.g., along a horizontal direction of FIGS. 3A and 3B). Where the auxiliary board portion 120 is formed in a substantially rectangular shape, the auxiliary board portion 120 may have a longer abscissa length than an ordinate length. The ordinate length of the auxiliary board portion 120 may be shorter than the ordinate length of the main board portion 110. Of course, the present invention is not limited thereto, but the shapes and dimensions of the main board portion 110 and the auxiliary board portion 120 may be changed according to the design of the LCD.

The connection board portion 130 connects the main board portion 110 and the auxiliary board portion 120. In one exemplary embodiment, the connection board portion 130 is preferably disposed between portions of the main board portion 110 and the auxiliary board portion 120. The connection board portion 130 may be formed in a region of the printed circuit board 100 where the flexible printed circuit board 3000 connecting the LCD panel 2000 to the main board portion 110 is not attached. The flexible printed circuit board 3000 may be connected to the main board portion 110 at a region except where the connection board portion 130 is formed.

Since the flexible printed circuit board 3000 may be connected to a lower central region of the LCD panel 2000, as shown in FIG. 3A, a single unit of the connection board portion 130 may be disposed directly adjacent to and continuous with one edge or an opposing edge of the main board portion 110 and the auxiliary board portion 120, respectively, so that the main board portion 110, the auxiliary board portion 120 and the connection board portion 130 are continuous with each other. That is, the main board portion 110, the auxiliary board portion 120 and the connection board portion 130 are an indivisible unit.

Such a continuous configuration is also referred to as integrally formed. As illustrated in FIG. 3A, the connection portion 130 is disposed being left-justified with left edges of the main board portion 110 and the auxiliary board portion 120. A whole of a left edge of the printed circuit board 100 is continuous across the main board portion 110, the connection board portion 130, and the auxiliary board portion 120. Since the connection board portion 130 is left justified, and since a length of the connection board portion 130 taken in a transverse direction of the printed circuit board 100 is less than a width of the printed circuit board 100 in the same transverse direction, a right edge of the printed circuit board 100 is discontinuous at a location corresponding to the connection board portion 130. An area formed by the main board portion 110, the connection board portion 130, the auxiliary board portion 120 and the discontinuous right edge of the printed circuit board 100 may also be referred to as an open area.

However, the present invention is not limited thereto. As shown in FIG. 3B, the connection board portion 130 includes a plurality of connection board portion units. In FIG. 3B, the plurality of connection board portion units are disposed at opposing sides of the main board portion 110 and the auxiliary board portion 120, relative to a connection space S. Both left and right edges of the printed circuit board 100 are continuous since each of the plurality of connection board portion units is respectively left-justified and right-justified. The connection board portions 130 formed at both of the opposing sides of the main board portion 110 and the auxiliary board portion 120, define the connection space S having four closed sides, such that this area is referred to as a closed area. The LCD panel 2000 and the main board portion 110 are configured to be connected to each other such that the flexible printed circuit board 3000 is accommodated by the connection space S.

In an exemplary embodiment of the present invention, the main board portion 110, the connection board portion 130 and the auxiliary board portion 120 may be manufactured as a single and continuous unit to form the printed circuit board 100. A portion of the single and continuous unit initially formed between the main board portion 110 and the auxiliary board portion 120 may be removed to define the connection space S for connecting the flexible printed circuit board 3000. At this time, the connection board portion 130 may be formed fully to one or another opposing side of both the main board portion 110 and the auxiliary board portion 120 by forming the connection space S with an open portion.

Wires extending from the auxiliary board portion 120 pass through the connection board portion 130, and lead to the wires of the main board portion 110 via the connection board portion 130. In order to transfer a signal of the auxiliary board portion 120 to the main board portion 110 through the connection board portion 130, the wires of the auxiliary board portion 120, and the wires of the main board portion 110 are arranged and collected together in a common region where a connection wiring portion is formed. The connection wiring portion may be disposed entirely on the connection board portion 130, or may overlap one or both of the main board portion 110 and the auxiliary board portion 120 in the common region. Advantageously, the connection board portion 130 is disposed continuously with the main board portion 110 and the auxiliary board portion 120, such that the main board portion 110 and the auxiliary board portion 120 are not separated from each other, and such that the wires of the main board portion 110 and the auxiliary board portion 120 connected to each other via the connection board portion 130 are disposed substantially continuously and uninterrupted on a surface of the printed circuit board 100.

As described above, the connection space S is configured to accommodate the flexible printed circuit board 3000 connecting the LCD panel 2000 to the printed circuit board 100 therein. The connection space S may be disposed between the main board portion 110, the auxiliary board portion 120 and the connection board portion 130 in a number of arrangements such that the flexible printed circuit board 3000 is accommodated by the connection space S, such as to pass completely through the connection space S.

As shown in FIG. 4A, the connection space S includes the installation space $S_1$ and the working space $S_2$. The installation space $S_1$ indicates a region in which the flexible printed circuit board 3000 is directly installed, and the working space $S_2$ indicates a remaining region of the connection space S required to connect the LCD panel 2000 to the main board portion 110 through the flexible printed circuit board 3000. Although it is illustrated in FIGS. 4A and 4B that an installation space $S_1$ and a working space $S_2$ include (e.g., overlap) a region of a printed circuit board 100, the installation space $S_1$ and the working space $S_2$ are intended to indicate a space between a main board portion 110 and an auxiliary board portion 120.

An ordinate length $Cd_2$ of the connection space S is equal to the sum of the ordinate length of the installation space $S_1$ and the ordinate length of the working space $S_2$. In one exemplary embodiment, the ordinate length of the installation space $S_1$ is substantially equal to or larger than a thickness of the flexible printed circuit board 3000. The ordinate length of the working space $S_2$ is configured to be of a sufficient dimension to connect the printed circuit board 100, e.g. preferably over 0.3 millimeter (mm). An area of the connection space S has an abscissa length $Cd_1$ which is a distance between an edge of the connection board portion 130 and a start point of the open area, such as the right edge of the printed circuit board 100. The ordinate length $Cd_2$ is a distance between the main board portion 110 and the auxiliary board portion 120.

Referring to FIG. 4A, in the printed circuit board 100 including the above configuration, the connection board portion 130 extends from one side (e.g., a left side) of an upper portion of the auxiliary board portion 120, and the connection space S is defined at the other side (e.g., opposing right side) of the upper portion of the auxiliary board portion 120. In addition, taken in a plan view as illustrated in FIG. 4A, the main board portion 110 is provided over or above the connection board portion 130 and the connection space S, and extends from an upper portion of the connection board portion 130. As described above, the connection board portion 130 and the connection space S are disposed between the auxiliary board portion 120 and the main board portion 110. In the plan view, one or the other side of a portion between the main board portion 110 and the auxiliary board portion 120 is open to form the printed circuit board 100 substantially in the shape of '[', or C-shaped. The LCD panel 2000 and the main board portion 110 can be connected through the connection space S. In an exemplary embodiment, when the LCD is assembled, the flexible printed circuit board 3000 connected to the LCD panel 2000 and the main board portion 110 positioned in the rear of the LCD panel 2000 is provided in a bent state (refer to FIG. 2).

In the exemplary embodiment of FIG. 4A, an abscissa length $Md_1$ of the main board portion 110 is substantially identical to an abscissa length Nd of the auxiliary board portion 120. The $Md_1$ and Nd may also be referred to as an abscissa length of the printed circuit board 100. However, the abscissa length $Md_1$ of the main board portion 110 may be different from the abscissa length Nd of the auxiliary board portion 120, according to the design of the LCD. In the illustrated embodiment, an abscissa length $Ld_1$ of the connection board portion 130 is smaller than both the abscissa length $Md_1$ of the main board portion 110 and the abscissa length Nd of the auxiliary board portion 120, and an abscissa length $Cd_1$ of the connection space S is smaller than both the abscissa length $Md_1$ of the main board portion 110 and the abscissa length Nd of the auxiliary board portion 120. The abscissa length $Md_1$ of the main board portion 110 may be equal to the sum of the abscissa length $Ld_1$ of the connection board portion 130 and the abscissa length $Cd_1$ of the connection space S.

In the same illustrated embodiment, an ordinate length $Ld_2$ of the connection board portion 130 is substantially identical to the ordinate length $Cd_2$ of the connection space S. Accordingly, each of lengths of the installation space $S_1$ and the working space $S_2$ in the connection space S is smaller than the ordinate length $Ld_2$ of the connection board portion 130, and the sum thereof is substantially equal to the ordinate length $Ld_2$ of the connection board portion 130.

If a space in which the second connection portion M is to be formed is deficient due to the LCD panel 2000 provided over the main board portion 110, as shown in FIG. 4B, a region of the main board portion 110 in which the second connection portion M is to be formed may be caused to protrude toward the auxiliary board portion 120 by a predetermined length, and then the second connection portion M may be formed therein. Where the connection space S is sufficiently large to connect the flexible printed circuit board 3000 to the LCD panel 2000 and the main board portion 110, although the ordinate length $Ld_2$ of the connection board portion 130 is reduced by a protruding ordinate length $Md_2$ of the main board portion 110 (e.g., equal to a protruding ordinate length $Ld_3$ of the connection board portion 130), the flexible printed circuit board 3000 can still be accommodated and connected.

FIG. 5 illustrates the LCD including the above configuration in an assembled state. In the illustrated embodiment, the connection space S is defined between the main board portion 110 and the auxiliary board portion 120. Although the main board portion 110 and the auxiliary board portion 120 are continuously and integrally formed, the LCD panel 2000 and the main board portion 110 can be directly connected to each other by only one of the flexible printed circuit board 3000 extending through the connection space S. Advantageously, since the main board portion 110 and the auxiliary board portion 120 are continuously and integrally formed, an additional flexible printed circuit board and additional connectors for connecting the main board portion 110 to the auxiliary board portion 120 can be omitted, thereby reducing the manufacturing cost.

Next, another exemplary embodiment of an LCD according to present invention will be described with reference to the accompanying drawings. Descriptions overlapping with those of the previous embodiment will be omitted or briefly explained.

Figure 6:
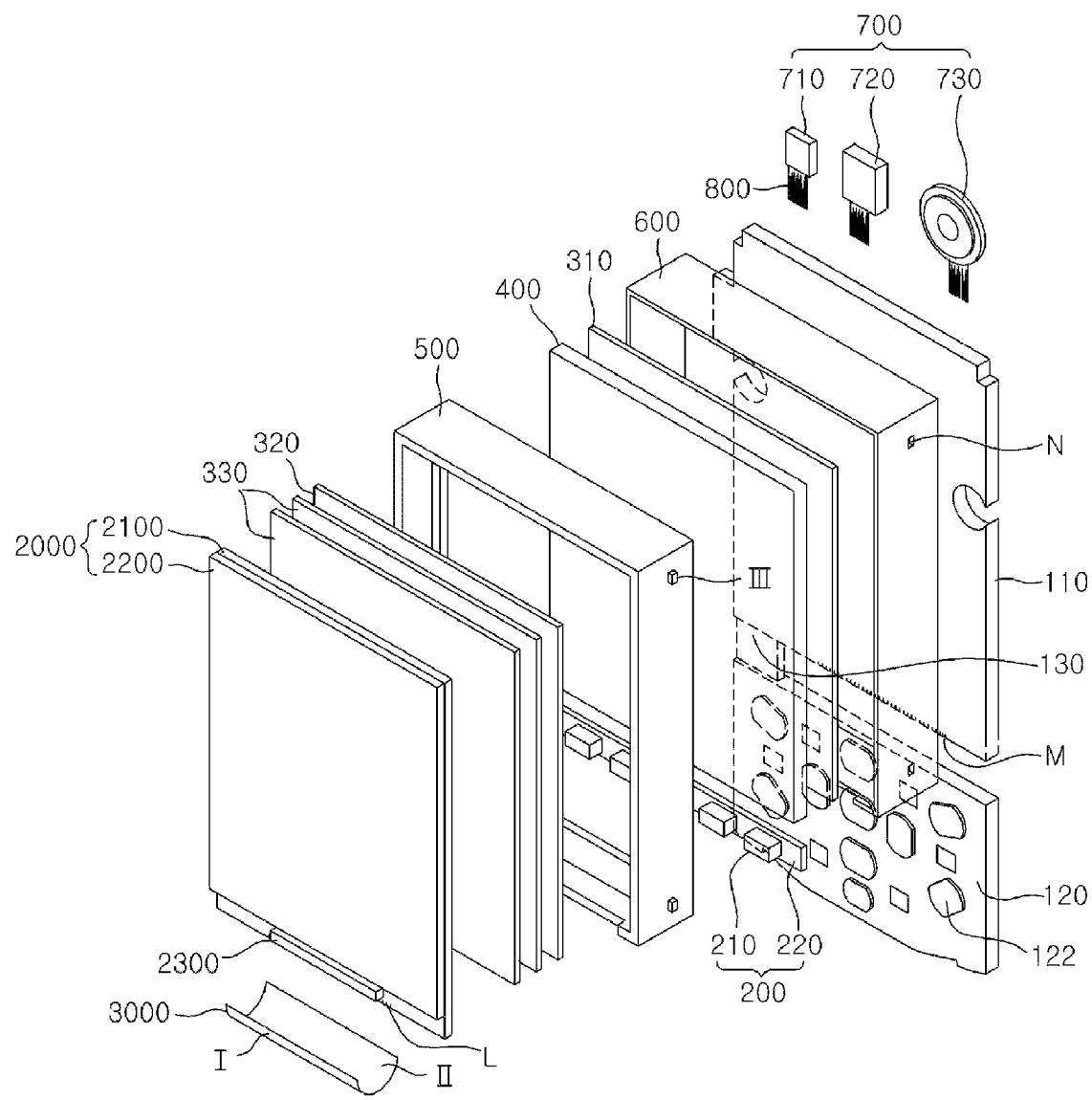
FIG. 6 is a schematic exploded perspective view of another exemplary embodiment of an LCD according to the present invention.
Figure 7:
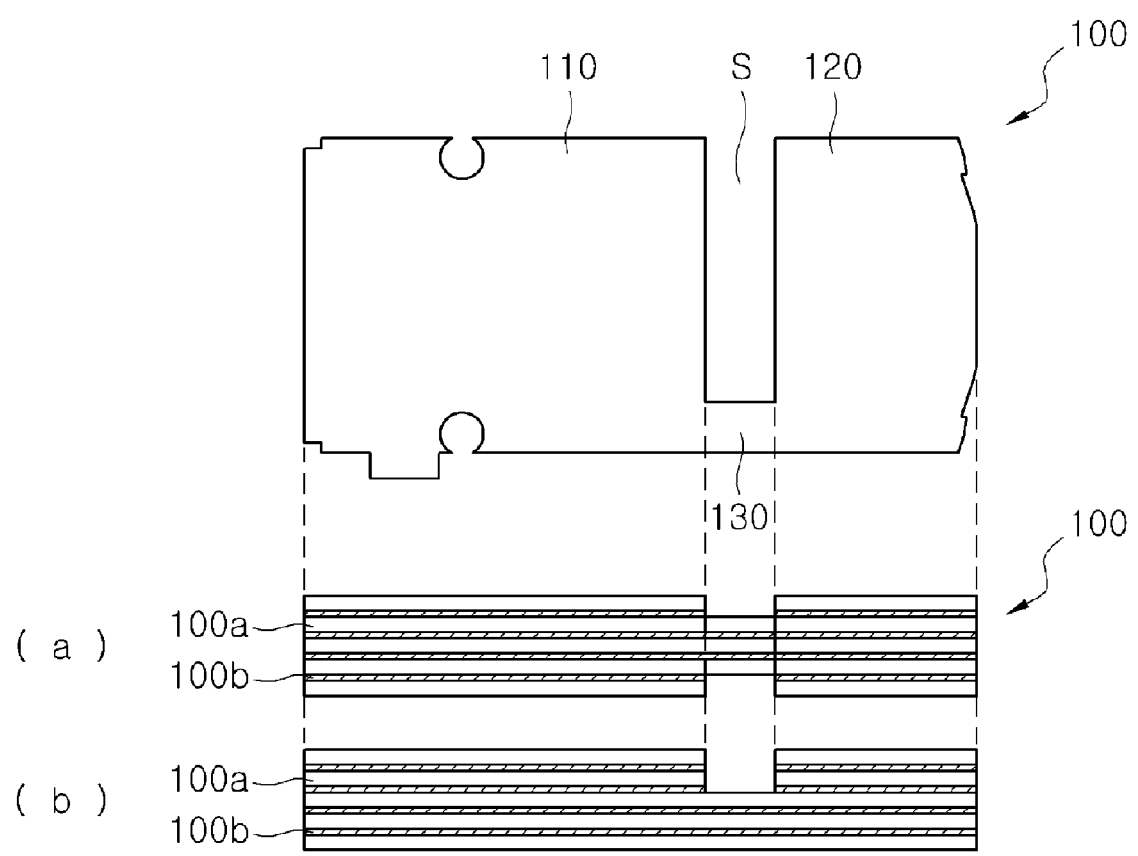
FIG. 7 shows a plan view and cross-sectional views of exemplary embodiments of printed circuit boards according to the present invention.
Figure 8:
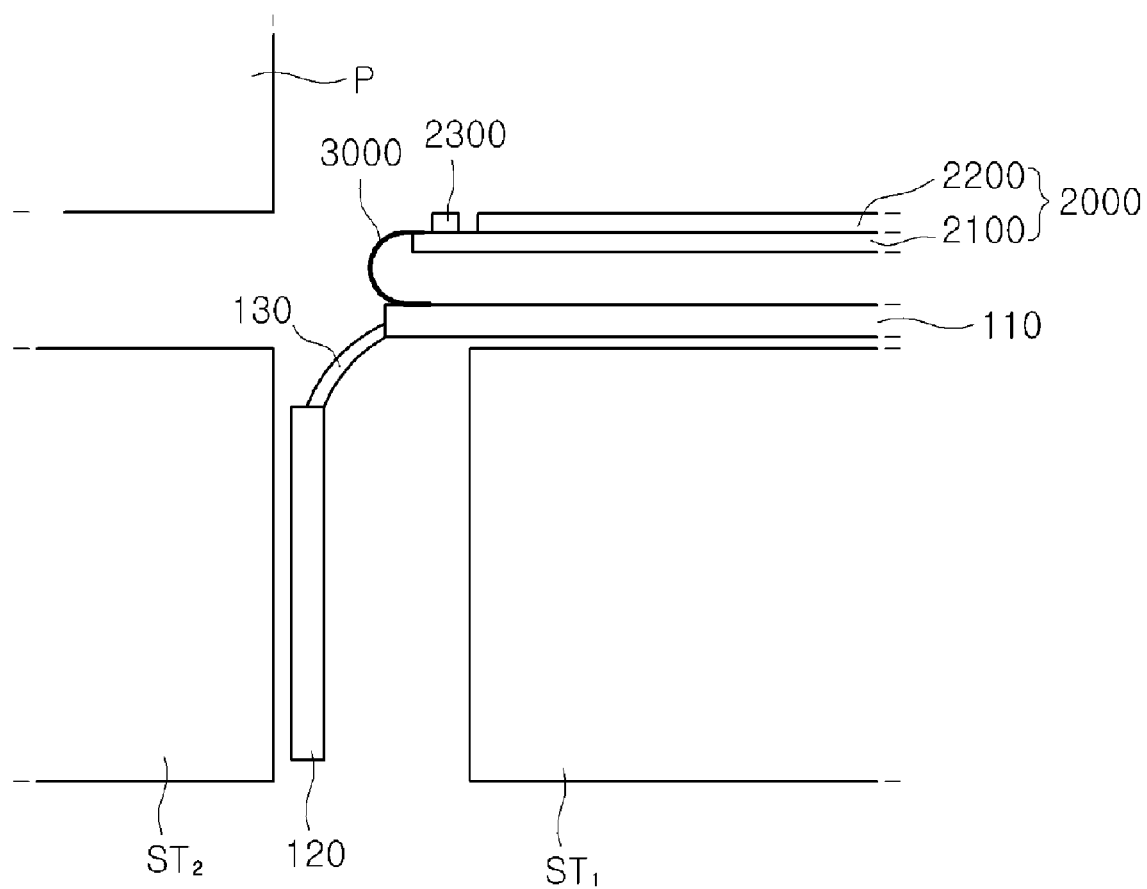
FIG. 8 is a side view illustrating an exemplary embodiment of a process of manufacturing the LCD according to the present invention.

FIG. 6 is a schematic exploded perspective view of an exemplary embodiment of an LCD according to the present invention, FIG. 7 shows a plan view and sectional views of exemplary embodiments of printed circuit boards according to the present invention, and FIG. 8 is a side view illustrating an exemplary embodiment of a process of manufacturing the LCD according to the present invention.

As shown in FIGS. 6 and 7, the LCD includes an LCD panel 2000, a backlight unit 1000 supplying light to the LCD panel 2000, and a printed circuit board 100 connected to the LCD panel 2000.

Like the previous embodiment, the printed circuit board 100 includes a main board portion 110 controlling the LCD panel 2000, an auxiliary board portion 120 provided with a plurality of buttons 122, such as direction buttons, and a connection board portion 130 connecting the main board portion 110 to the auxiliary board portion 120 and including a connection space S defined therein. The printed circuit board 100 may be a printed circuit board having various multiple layers, and the multiple layers may present across all portions of the printed circuit board 100. In the illustrated embodiment, a four-layered printed circuit board will be described as an example of the printed circuit board 100, but the present invention is not limited thereto.

The printed circuit board 100 controls the LCD panel 2000, and includes the main board portion 110, the auxiliary board portion 120, and the connection board portion 130 connecting the main board portion 110 to the auxiliary board portion 120, as described in the embodiment of FIGS. 1-5, whereby the connection space S is defined between the main board portion 110 and the auxiliary board portion 120.

The main board portion 110 generates an image signal, applies the image signal to the LCD panel 2000, and drives the backlight unit 1000. The LCD panel 2000 may be mounted on a front surface of the main board portion 110, and various elements (not shown) required for driving of the LCD panel 2000 may be mounted on a rear surface of the main board portion 110 opposing the front surface. A second connection portion M may be formed in a lower portion of the front and/or rear surface of the main board portion 110 to accommodate a flexible printed circuit board 3000 connected to an LCD panel driver 2300.

The auxiliary board portion 120 is includes buttons 122 for controlling the LCD panel 2000. As in the illustrated embodiment, the auxiliary board portion 120 may be formed under the main board portion 110 in plan view as shown in FIGS. 1-5.

The connection board portion 130 connects the main board portion 110 to the auxiliary board portion 120. The connection board portion 130 is disposed between the main board portion 110 and the auxiliary board portion 120, and is considered to extend from both the main board portion 110 and the auxiliary board portion 120. The connection board portion 130 is disposed at a region of one or the other side (e.g., left or right in plan view) of the main board portion 110 and the auxiliary board portion 120, and defines the connection space S therebetween.

Referring to FIG. 7, in the printed circuit board 100, the number of layers of the connection board portion 130 and an overall thickness of the connection board portion 130 is reduced. With the reduced thickness of the connection board portion 130, the connection board portion 130 is more flexible, such as for promoting bending of the printed circuit board 100 at the connection board portion 130. When the flexible printed circuit board 3000 connected to the main board portion 110 is pressed and attached to the LCD panel 2000, a defect may occur since the connection board portion 130 is compressed due to a manufacturing process. Advantageously, in the printed circuit board 100 according to the illustrated embodiment, the thickness of the connection board portion 130 is reduced, so that the connection board portion 130 can have flexibility, thereby causing the auxiliary board portion 120 not to be compressed during assembly of the LCD. Furthermore, since the main board portion 110, the auxiliary board portion 120 and the connection board portion 130 are continuously disposed as a single, uninterrupted unit, wirings of the three aforementioned members extending therebetween may also be continuously disposed without interruption, from points on the main board portion 110 to points on the auxiliary board portion 120.

Referring to FIG. 7, in a four-layered printed circuit board, wiring layers 100b may be formed on both surfaces of a resin layer 100a, and a resin layer 100a and a wiring layer 100b may be successively formed on outer surfaces of the wire layers 100b. Accordingly, the four-layered printed circuit board may be composed of a plurality of resin layers 100a and four wiring layers 100b that are alternately formed. The printed circuit board 100 according to the illustrated embodiment is considered as the aforementioned four-layered printed circuit board structure as there are four wiring layers 100b.

Each of the main board portion 110 and the auxiliary board portion 120 is formed to have of a four-layered printed circuit board structure, and the connection board portion 130 is formed to have a two-layered printed circuit board structure. In an exemplary embodiment, the reduced layers of the connection board portion 130 may be formed by etching surfaces on opposing sides of the connection board portion 130 of the four-layered printed circuit boards, thereby reducing the thickness of the connection board portion 130 and obtaining flexibility.

In exemplary embodiments, the number of layers of the main board portion 110 may be equal to or different from that of the auxiliary board portion 120. As shown in FIG. 7(a), the connection board portion 130 may include two layers, e.g., the resin and wire layers. Meanwhile, in FIG. 7(a), both outer surfaces of the four-layered printed circuit board 100 are etched, such that the connection board portion 130 has a structure with the resin and wire layers positioned substantially in a central portion of a thickness of the printed circuit board 100. Alternatively, as shown in FIG. 7(b), one of the outer surfaces of the four-layered printed circuit board is etched, such that the connection board portion 130 may have a structure with the resin and wire layers positioned towards at an outer portion of the printed circuit board 100 thickness.

The four-layered printed circuit board has been explained as an exemplary embodiment, but the present invention is not limited thereto. Each of the main board portion 110 and the auxiliary board portion 120 may be a multi-layered printed circuit board, and the connection board portion 130 may be provided with flexibility by removing portions of the multi-layered printed circuit board, such as by etching. Alternatively, if the printed circuit boards used as the main board portion 110 and the auxiliary board portion 120 have initial flexibility, the connection board portion 130 also has flexibility. In this case, it is not necessary to reduce the number of layers of the connection board portion 130.

FIG. 8 shows an exemplary embodiment of a process of assembling an LCD. Referring to FIG. 8, in the LCD having the configuration of FIGS. 6 and 7, when a further process of connecting the flexible printed circuit board 3000 (already connected to the main board portion 110) to a first connection portion L of the LCD panel 2000 is carried out, the main board portion 110 and the auxiliary board portion 120 may be positioned so as to reduce the potential of damage to the auxiliary board portion 120. The LCD panel 2000 and the main board portion 110 may be positioned on a first stage $ST_1$, and the auxiliary board portion 120 may be bent away from the first connection portion L, due to the advantageous flexibility of the connection board portion 130. The auxiliary board portion 120 is then positioned between the first stage $ST_1$ and a second stage $ST_2$ spaced apart from each other. A region of the first connection portion L is positioned between the second stage $ST_2$ and a pressing portion P so that the first connection portion L and the flexible printed circuit board 3000 can be coupled to each other, such as by pressing the two elements together. Since the auxiliary board portion 120 is positioned between the first stage $ST_1$ and the second stage $ST_2$ as described above, and away from the apparatus and process of coupling the flexible printed circuit board 3000 and the first connection portion L of the LCD panel 2000, although the first connection portion L with the flexible printed circuit board 3000 positioned thereon may be contacted during the pressing or encroached upon by manufacturing tools, the auxiliary board portion 120 is not damaged.

In the illustrated embodiment, the connection board portion 130 connecting the main board portion 110 to the auxiliary board portion 120 is reduced in thickness to promote flexibility of the printed circuit board 100. Advantageously, an angle of deformation or bending defined by positions of the main board portion 110 and the auxiliary board portion 120, can be adjusted. Moreover, during manufacturing processes, the connection board portion 130 can be relatively freely bent, so that when the first connection portion L of the LCD panel 2000 and the second connection portion M of the main board portion 110 are connected through the flexible printed circuit board 3000, the connection board portion 130 is bent away from a remaining part of the LCD assembly, such as to reduce or effectively prevent the auxiliary board portion 120 from being damaged.

According to the embodiments of the present invention, there is provided a display device including a printed circuit board including a main board portion and an auxiliary board portion. A connection space is defined between the main board portion and the auxiliary board portion. A display panel and the main board portion are connected through the connection space, and the main board portion and the auxiliary board portion are continuously disposed, such as to be integrally formed with each other.

According to the embodiments of the present invention, there is provided a display device including a main board portion and an auxiliary board portion continuously formed as a single and uninterrupted unit, such as to omit an additional and separate flexible printed circuit board and connectors for connecting the main board portion to the auxiliary board portion, advantageously reducing the manufacturing cost.

According to the embodiments of the present invention, there is provided a manufacturing method for assembly of a display device including a continuous printed circuit board. The method excludes a separate and additional connector mounting process and flexible printed circuit board connecting process for connecting a main board portion to an auxiliary board portion, advantageously reducing a working time and improving productivity of the assembly of the display device.

Although the present invention has been described in connection with the exemplary embodiments and the accompanying drawings, it can be understood that those skilled in the art can make various modifications and changes thereto without departing from the technical spirit of the invention defined by the appended claims.

In the meantime, although the LCD having an LCD panel has been explained by way of example in the foregoing embodiments, the present invention is not limited thereto, but may be applied to a display device other than the LCD having an LCD panel, e.g., a display device having an OLED panel.

What is claimed is:

1. A display device, comprising:
a display panel displaying images;
a printed circuit board disposed at a rear of the display panel, the printed circuit board including:
a main board portion connected to the display panel;
a connection board portion extending from a region of a side of the main board portion; and
an auxiliary board portion extending from the connection board portion;
wherein the main board portion, the connection board portion and the auxiliary board portion are disposed continuously with each other, and
a flexible printed circuit board which connects the display panel to the main board portion.

2. The display device as claimed in claim 1, wherein the connection board portion is disposed at only a first side, or both the first side and a second side of the side of the main board portion,
a connection space is defined between the main board portion and the auxiliary board portion where the connection board portion is not disposed, and
the first side and the second side of the side of the main board portion are disposed opposite to each other relative to the connection space.

3. The display device as claimed in claim 2, wherein the flexible printed circuit board extends through the connection space to connect the display panel to the main board portion.

4. The display device as claimed in claim 3, wherein the connection space comprises a space corresponding to a thickness of the flexible printed circuit board, and a working space corresponding to a remaining dimension of the connection space required to connect the display panel to the main board portion through the flexible printed circuit board.

5. The display device as claimed in claim 1, wherein the main board portion, the connection board portion and the auxiliary board portion extend in a first direction in plan view, and a length of the connection board portion in a second direction substantially perpendicular to the first direction, is smaller than lengths of the main board portion and the auxiliary board portion in the second direction.

6. The display device as claimed in claim 1, further comprising a display panel driver connected to the display panel and driving the display panel,
wherein the flexible printed circuit board is connected to the display panel through the display panel driver.

7. The display device as claimed in claim 6, wherein the display panel driver is disposed on a portion of the display panel adjacent to the auxiliary board portion.

8. The display device as claimed in claim 6, wherein a first end of the flexible printed circuit board is connected to the display panel driver, and a second end opposing the first end is connected to a side of the main board portion adjacent to the auxiliary board portion.

9. The display device as claimed in claim 1, further comprising a functional module connected to the main board portion,
wherein the functional module comprises at least one of a vibration module, a speaker module and a camera module.

10. The display device as claimed in claim 9, wherein the functional module is connected to a side of the main board portion opposing the auxiliary board portion relative to the main board portion.

11. The display device as claimed in claim 1, wherein the display panel is positioned on a first surface of the main board portion, and an element controlling the display panel is mounted on a second surface of the main board portion opposing the first surface relative to the main board portion.

12. The display device as claimed in claim 1, wherein one or more buttons sending a signal to the main board portion are disposed on a first surface of the auxiliary board portion.

13. The display device as claimed in claim 1, further comprising a sliding module slidably disposed with the display device at a rear of the display device,
wherein the sliding module comprises a communication module, a keypad portion provided with one or more buttons, and a battery.

14. A display device comprising:
a display panel displaying images; and
a printed circuit board disposed at a rear of the display panel, the printed circuit board including:
a main board portion connected to the display panel;
a connection board portion extending from a region of a side of the main board portion; and
an auxiliary board portion extending from the connection board portion;

wherein the main board portion, the connection board portion and the auxiliary board portion are disposed continuously with each other, wherein wires are on the main board portion, the auxiliary board portion and the connection board portion, and the wires of the main board portion and the auxiliary board portion are connected to each other through the wires of the connection board portion.

15. The display device as claimed in claim 14, wherein the printed circuit board comprises a multi-layered printed circuit board, and the multi-layered printed circuit board comprises at least one resin layer and at least one wiring layer alternately disposed with each other.

16. The display device as claimed in claim 15, wherein a number of layers of the main board portion is different from a number of layers of the connection board portion.

17. A cellular phone, comprising:
a display device including:
 a display panel displaying images;
 a printed circuit board disposed in a rear of the display panel, the printed circuit board including:
  a main board portion connected to the display panel,
  a connection board portion extending from a region of a side of the main board portion, and
  an auxiliary board portion extending from the connection board portion;
  wherein the main board portion, the connection board portion and the auxiliary board portion are disposed continuously with each other; and
 a flexible printed circuit board which connects the display panel to the main board portion; and
a sliding module slidably disposed with the display device at a rear of the display device.

18. The cellular phone as claimed in claim 17, wherein
a connection space is defined between the main board portion and the auxiliary board portion where the connection board portion is not disposed, and
the flexible printed circuit board extends completely through the connection space.

19. The cellular phone as claimed in claim 18, wherein the sliding module comprises a communication module, a keypad portion provided with one or more buttons, and a battery.

20. A method of forming a display device, the method comprising:
forming a printed circuit board as an indivisible unit;
forming a display panel displaying images;
disposing the printed circuit board at a rear of the display panel, and
connecting the display panel and the printed circuit board to each other with a flexible printed circuit board,
wherein the printed circuit board includes:
 a main board portion connected to the display panel;
 an auxiliary board portion;
 a connection board portion disposed between the main board portion and the auxiliary board portion; and
 a connection passage disposed between the main board portion and the auxiliary board portion where the connection board portion is not disposed.

21. The method of forming a display device as claimed in claim 20, further comprising connecting a first end of the flexible printed circuit board to the display panel, and a second end opposing the first end to a side of the main board portion adjacent to the auxiliary board portion, and disposing the flexible printed circuit board through the connection passage.

* * * * *